United States Patent
Zhang (10) Patent No.: US 8,993,425 B2
(45) Date of Patent: Mar. 31, 2015

(54) TUNNELING FIELD EFFECT TRANSISTOR (TFET) FORMED BY ASYMMETRIC ION IMPLANTATION AND METHOD OF MAKING SAME

(71) Applicant: Taiwan Semiconductor Manufacturing Company, Ltd., Hsin-Chu (TW)

(72) Inventor: Ying Zhang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 153 days.

(21) Appl. No.: 13/718,992

(22) Filed: Dec. 18, 2012

(65) Prior Publication Data

US 2014/0170827 A1   Jun. 19, 2014

(51) Int. Cl.
*H01L 21/425* (2006.01)
*H01L 29/66* (2006.01)
*H01L 29/739* (2006.01)

(52) U.S. Cl.
CPC ...... *H01L 29/66356* (2013.01); *H01L 29/7391* (2013.01); *Y10S 438/918* (2013.01)
USPC ........... 438/528; 438/525; 438/527; 438/595; 438/752; 438/757; 438/918; 257/E21.059

(58) Field of Classification Search
CPC ................................................. H01L 29/7391
USPC ......... 438/525, 527, 528, 595, 745, 752, 757, 438/918, 924; 257/E21.059
See application file for complete search history.

(56) References Cited

U.S. PATENT DOCUMENTS

| | | | |
|---|---|---|---|
| 6,133,079 A | 10/2000 | Zhu et al. | |
| 6,902,971 B2 * | 6/2005 | Grudowski | 438/218 |
| 7,646,039 B2 * | 1/2010 | Zhu et al. | 257/192 |
| 8,384,122 B1 | 2/2013 | Hu et al. | |
| 8,592,911 B2 * | 11/2013 | Liang et al. | 257/356 |
| 2002/0072180 A1 | 6/2002 | Yugami et al. | |
| 2003/0224617 A1 * | 12/2003 | Baek et al. | 438/763 |
| 2005/0275010 A1 | 12/2005 | Chen et al. | |
| 2006/0189080 A1 | 8/2006 | Lee et al. | |
| 2007/0045753 A1 | 3/2007 | Pae et al. | |
| 2009/0152650 A1 | 6/2009 | Chudzik et al. | |
| 2010/0038713 A1 | 2/2010 | Majhi et al. | |
| 2014/0158990 A1 | 6/2014 | Zhang | |

OTHER PUBLICATIONS

Patel, P. et al., "A Low Voltage Steep Turn-Off Tunnel Transistor Design," International Conference on Simulation of Semiconductor Processes and Devices ("SISPAD"), 2009, pp. 23-26.
Sterkel, M., et al., "Complementary Tunneling-Transistors (TFET): Fabrication and Application down to the 65 nm CMOS-node," SINANO Workshop: Nanoscale CMOS and emerging post-CMOS logic and memory nanodevices, Sep. 16, 2005, 27 pages.

* cited by examiner

*Primary Examiner* — Michelle Mandala
(74) *Attorney, Agent, or Firm* — Slater & Matsil, L.L.P.

(57) ABSTRACT

An embodiment integrated circuit device and a method of making the same. The embodiment method includes forming a first nitride layer over a gate stack supported by a substrate, implanting germanium ions in the first nitride layer in a direction forming an acute angle with a top surface of the substrate, etching away germanium-implanted portions of the first nitride layer to form a first asymmetric nitride spacer confined to a first side of the gate stack, the first asymmetric nitride spacer protecting a first source/drain region of the substrate from a first ion implantation, and implanting ions in a second source/drain region of the substrate on a second side of the gate stack unprotected by the first asymmetric nitride spacer to form a first source/drain.

20 Claims, 6 Drawing Sheets

TUNNELING FIELD EFFECT TRANSISTOR (TFET) FORMED BY ASYMMETRIC ION IMPLANTATION AND METHOD OF MAKING SAME

BACKGROUND

Advances in the semiconductor industry have reduced the size of transistors in integrated circuits (ICs) to 32 nanometers and smaller. The decrease in transistor sizes leads to decreases in power supply voltage to the transistors. As the power supply voltage has decreased, the threshold voltage of the transistors in the ICs has also decreased.

Lower threshold voltages are difficult to obtain in a conventional metal-oxide-semiconductor field-effect transistor (MOSFET). Indeed, as the threshold voltage is reduced the ratio of on current to off current ($I_{on}/I_{off}$) also decreases. The on current refers to the current through the MOSFET when an applied gate voltage is above the threshold voltage, and the off current refers to current through the MOSFET when the applied gate voltage is below the threshold voltage.

The on current to off current ratio may be improved by using a tunneling field-effect transistor (TFET). The TFET takes advantage of band-to-band tunneling (BTBT) to increase the achievable on current ($I_{on}$), which permits further reductions in threshold voltage, power supply voltage, and transistor size. Unfortunately, forming the source, which has one doping type, and the drain, which has another doping type, in the TFET such that the source and drain are both suitably self-aligned with the gate stack is challenging.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure.

The present disclosure will be described with respect to embodiments in a specific context, namely a tunneling field effect transistor (TFET). The concept may also be applied, however, to other integrated circuits (e.g., a fin field effect transistor (FinFET), a planar metal-oxide-semiconductor field-effect transistor (MOSFET), a double-gate MOSFET, a tri-gate MOSFET, etc.) and electronic structures.

Figure 1:
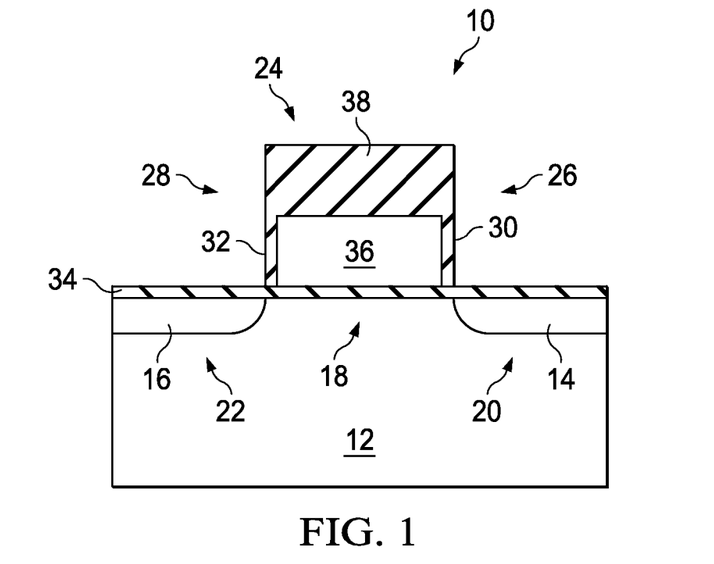
FIG. 1 is a cross section of an embodiment TFET having a drain and a source that are both self-aligned with a gate stack.

Referring now to FIG. 1, an embodiment TFET 10 is illustrated. As shown, the TFET 10 includes a substrate 12 supporting a source 14 with a first doping type (e.g., p-type) and a drain 16 with a second doping type (e.g., n-type) on opposing sides of a channel region 18 in the substrate 12. In an embodiment, the channel region 18 is disposed in a fin of a FinFET device as opposed to the TFET 10 of FIG. 1. In an embodiment, the source 14 is disposed in a first source/drain region 20 of the substrate 12 and the drain 16 is disposed in a second source/drain region 22 of the substrate 12. In an embodiment, the substrate 12 is formed from silicon, a silicon-containing material, an intrinsic silicon, and so on.

Still referring to FIG. 1, the TFET 10 also includes a gate stack 24. In an embodiment, the gate stack 24 is a metal gate/high-k (MG/HK) gate stack. As shown, the source 14 is disposed on a first side 26 of the gate stack 24 while the drain 16 is disposed on a second side 28 of the gate stack 24. In addition, and as will be more fully explained below, each of the source 14 and the drain 16 is self-aligned with the gate stack 24. In other words, a periphery of the source 14 closest to the channel 18 is generally vertically-aligned with a first sidewall 30 of the gate stack 24. Likewise, a periphery of the drain 16 closest to the channel 18 is generally vertically-aligned with a second sidewall 32 of the gate stack 24.

In an embodiment, the gate stack 24 includes a gate dielectric layer 34 (e.g., a gate oxide layer), a gate polysilicon 36, and an oxide mask 38. As shown, in an embodiment the gate dielectric layer 34 extends over the source 14, the channel region 18 of the substrate 12, and the drain 16. In addition, the gate polysilicon 36 is disposed over the gate dielectric layer 34 while the oxide mask 38 is disposed over and/or around the gate polysilicon 36.

Figure 2A:
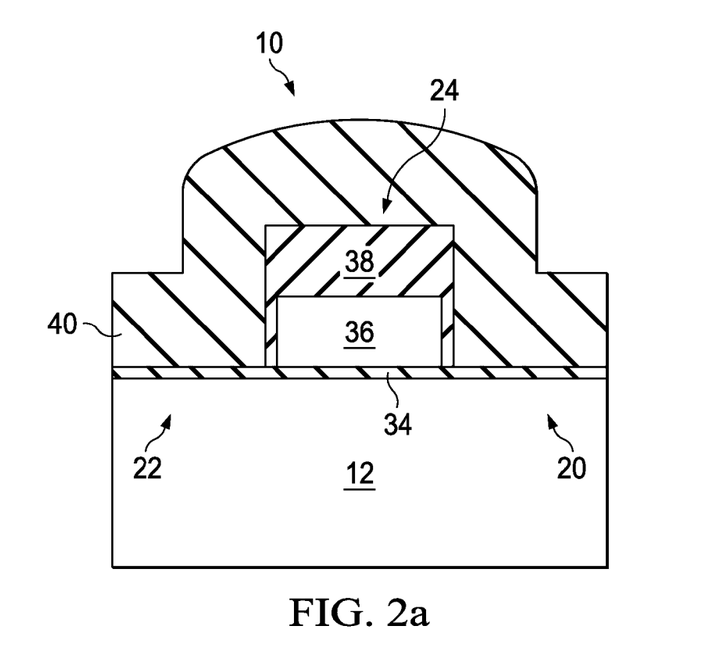
FIGS. 2a-2i collectively illustrate a method of forming the embodiment TFET of FIG. 1.
Figure 2B:
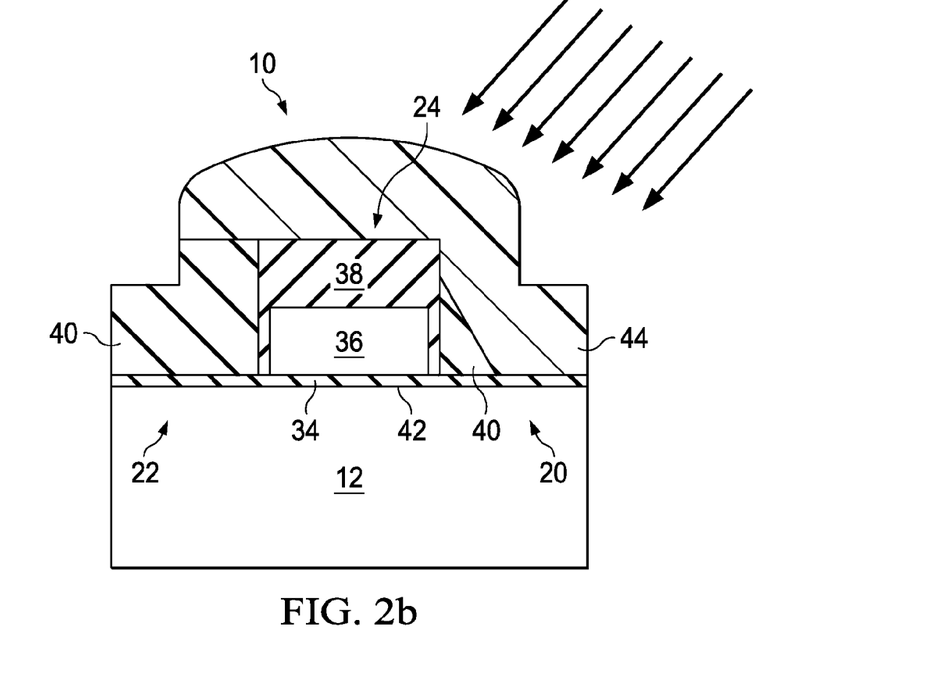

Referring now to FIGS. 2a-2i, an embodiment method of forming the TFET 10 of FIG. 1 is collectively illustrated. As shown in FIG. 2a, the method begins by forming the gate stack 24 over the substrate 12. In an embodiment, the gate stack 24 is a metal gate/high-k (MG/HK) gate stack. In an embodiment, the gate stack 24 is formed using a gate first integration flow. In an embodiment, the gate stack 24 is formed using a gate last integration flow. In an embodiment, the gate stack 24 is employed in a multi-gate transistor having a plurality of sources, drains, and channels. In other words, the gate stack 24 extends over a plurality of channels supported. In another embodiment, the gate stack 24 is a polysilicon gate as described above.

Still referring to FIG. 2a, a nitride layer 40 is formed over the gate stack 24. In an embodiment, the nitride layer 40 is a low-temperature nitride film. Moving now to FIG. 2b, germanium ions (Ge+) are implanted in the nitride layer 40 (as indicated by the arrows). As shown, in an embodiment the germanium ions are implanted in a direction that forms an acute angle with a top surface 42 of the substrate 12.

Figure 2C:
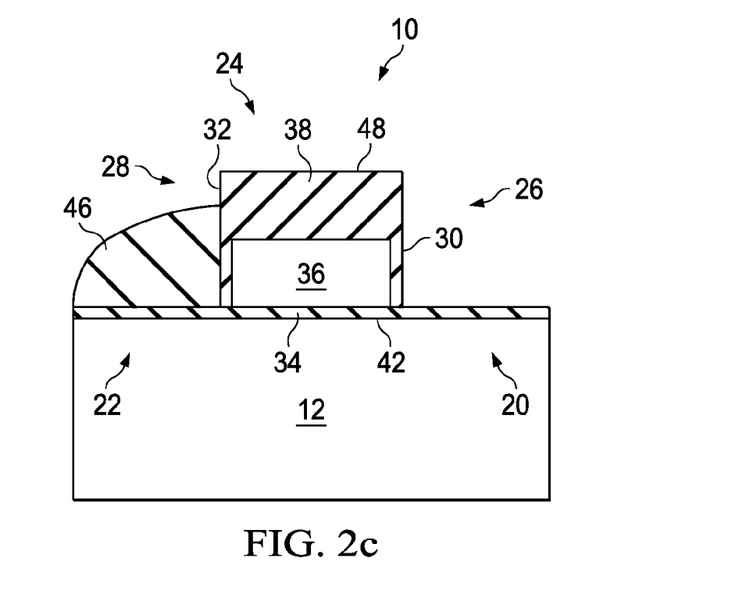

Referring now to FIG. 2c, the germanium-implanted portions 44 of the nitride layer 40 (FIG. 2b) are removed to form an asymmetric nitride spacer 46, which may be formed from the low-temperature nitride. In an embodiment, the germanium-implanted portions 44 of the nitride layer 40 are removed by a plasma etching process. In an embodiment, the germanium-implanted portions 44 of the nitride layer 40 are selectively removed using fluoride (F), carbon (C), and/or hydrogen (H) containing plasmas such as, for example, mixtures of $CF_4/CHF_3$, $CH_2F_2$, $CH_3F$, Argon (Ar), and so on. The selectivity of ion implanted nitride film versus deposited nitride film may be 3:1 or higher due to the reactivity of F-bonding with more dangling bonds of SiNx, i.e., amorphized nitride film. In an embodiment, the germanium-implanted portions 44 of the nitride layer 40 are removed by a plasma etching process. The geranium-implanted portions 44 etch away faster than the portions of the nitride layer 40 that are not exposed to the germanium implantation. In an embodiment, the asymmetric nitride spacer 46 is supported by the gate dielectric layer 34 and abuts the second sidewall 32 of the gate stack 24.

As shown in FIG. 2c, the asymmetric nitride spacer 46 is confined to the second side 28 of the gate stack 24. In this configuration, the asymmetric nitride spacer 46 protects or covers the second source/drain region 22 of the substrate 12 from an ion implantation. However, the asymmetric nitride spacer 46 does not overlap a top surface 48 of the gate stack 24. In other words, the asymmetric nitride spacer 46 does not cover or protect the top surface 48 of the gate stack 24. In addition, the asymmetric nitride spacer 46 also leaves the first source/drain region 20 of the substrate 12 on the first side 26 of the gate stack 24 unprotected or uncovered.

Figure 2D:
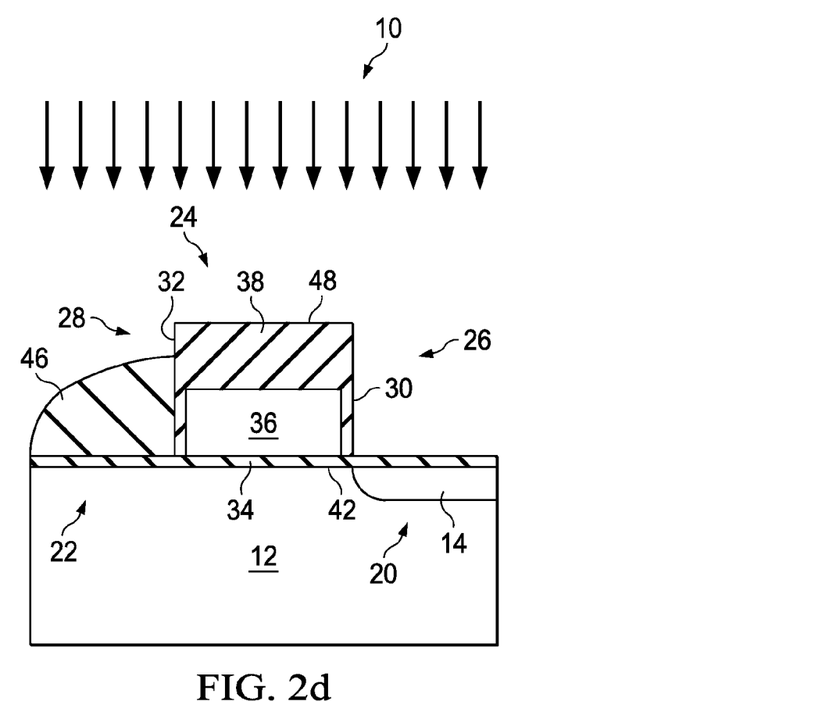
Figure 2E:
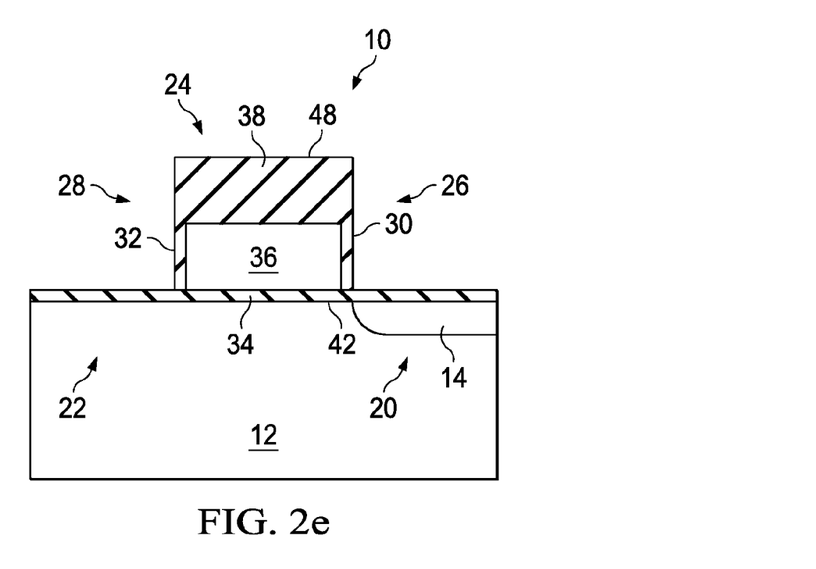

Referring now to FIG. 2d, p-type impurities (as indicated by the arrows) are implanted in the first source/drain region 20 of the substrate 12 on the first side 26 of the gate stack 24, which is unprotected by the asymmetric nitride spacer 46, to form the source 14. In an embodiment, the p-type impurities may be boron, boron-based molecules (e.g., FxBy molecules or molecular clusters), indium, and so on. After the source 14 has been formed, the asymmetric nitride spacer 46 is removed as shown in FIG. 2e. In an embodiment, the asymmetric nitride spacer 46 is removed using a wet etching process.

Figure 2F:
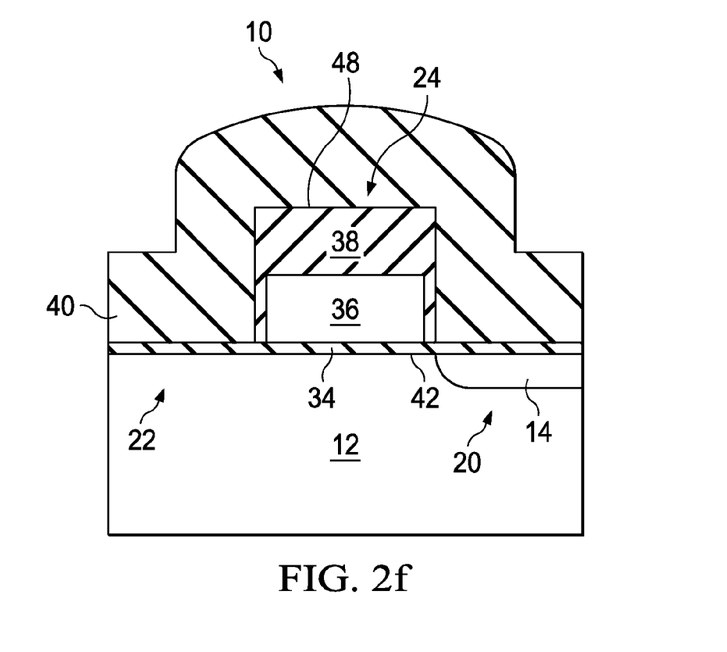
Figure 2G:
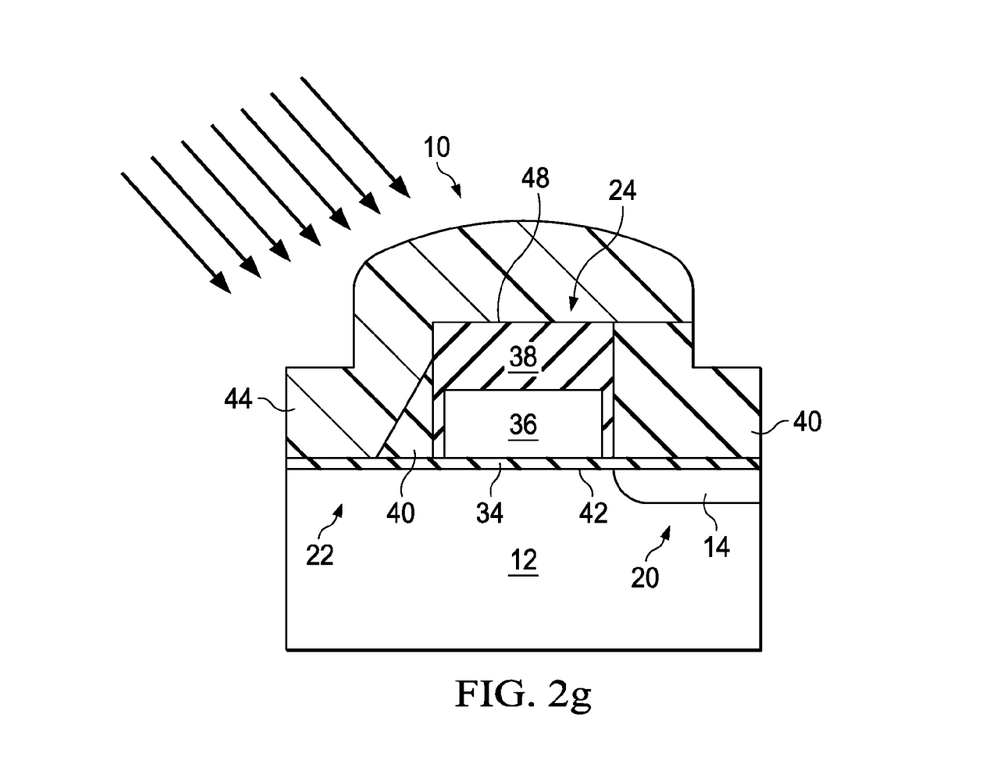

Referring now to FIGS. 2f-2i, the process flow generally repeats with a different doping in order to form the drain 16. Indeed, as shown in FIG. 2f, another nitride layer 40 is formed over the gate stack 24. As before, the nitride layer 40 may be a low-temperature nitride film. Moving now to FIG. 2g, germanium ions (Ge+) are implanted in the nitride layer 40 (as indicated by the arrows). As shown, in an embodiment the germanium ions are implanted in a direction that forms an acute angle with the top surface 48 of the substrate 12. Notably, the acute angle of implantation in FIG. 2g may be the same or different than the acute angle of implantation in FIG. 2b.

Figure 2H:
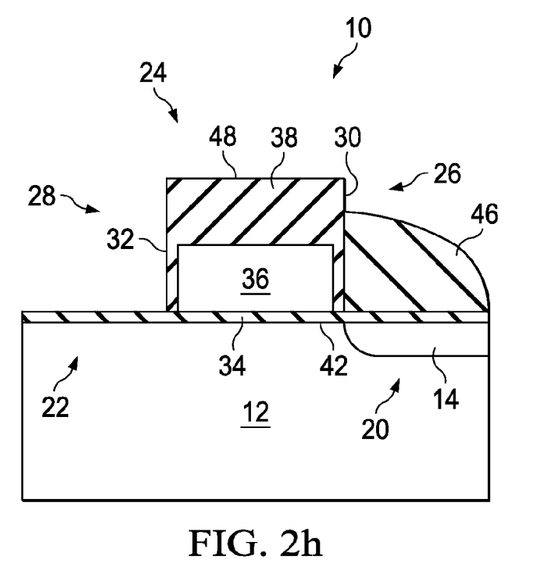

Referring now to FIG. 2h, the germanium-implanted portions 44 of the nitride layer 40 (FIG. 2g) are removed to form an asymmetric nitride spacer 46, which may be formed from the low-temperature nitride. In an embodiment, the germanium-implanted portions 44 of the nitride layer 40 are removed by a plasma etching process. The geranium-implanted portions 44 etch away faster than the portions of the nitride layer 40 that are not exposed to the germanium implantation. In an embodiment, the asymmetric nitride spacer 46 is supported by the gate dielectric layer 34 and abuts the first sidewall 30 of the gate stack 24.

As shown in FIG. 2h, the asymmetric nitride spacer 46 is confined to the first side 26 of the gate stack 24. In this configuration, the asymmetric nitride spacer 46 protects or covers the first source/drain region 20 of the substrate 12 and the source 14 from an ion implantation. However, the asymmetric nitride spacer 46 does not overlap the top surface 48 of the gate stack 24. In other words, the asymmetric nitride spacer 46 does not cover or protect the top surface 48 of the gate stack 24. In addition, the asymmetric nitride spacer 46 also leaves the second source/drain region 22 of the substrate 12 on the second side 28 of the gate stack 24 unprotected or uncovered.

Figure 2I:
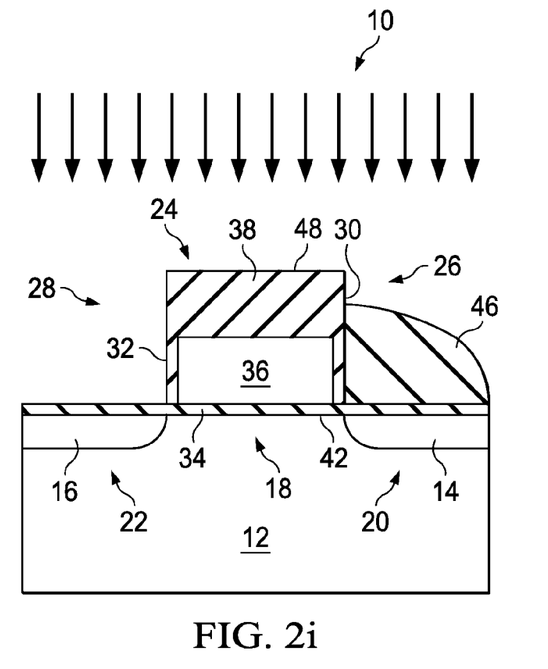

Referring now to FIG. 2i, n-type impurities (as indicated by the arrows) are implanted in the first source/drain region 20 of the substrate 12 on the first side 26 of the gate stack 24, which is unprotected by the asymmetric nitride spacer 46, to form the drain 16. In an embodiment, the n-type impurities may be phosphorus, arsenic, antimony, and so on. After the drain 16 has been formed, the asymmetric nitride spacer 46 is removed as shown in FIG. 1. In an embodiment, the asymmetric nitride spacer 46 is removed using a wet etching process.

Figure 3:
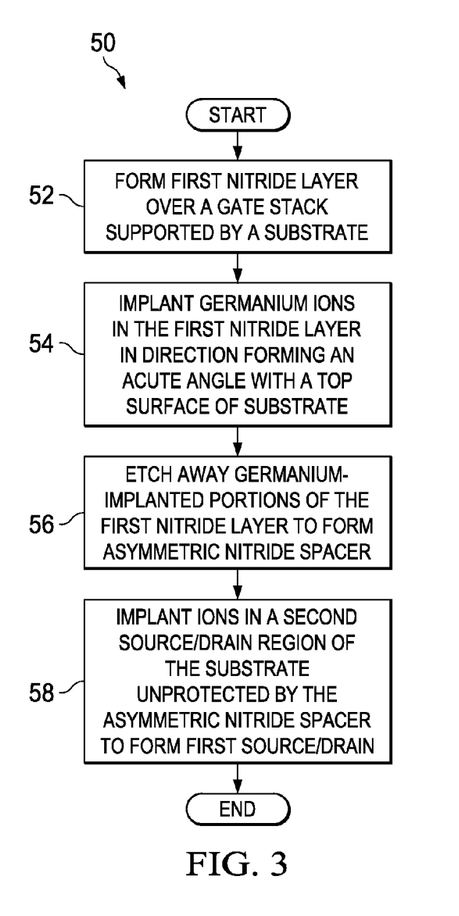
FIG. 3 illustrates an embodiment method of forming the TFET of FIG. 1.

Referring now to FIG. 3, an embodiment method 50 of forming an integrated circuit (e.g., the TFET 10 of FIG. 1) is provided. In block 52, a first nitride layer is formed over a gate stack supported by a substrate. In block 54, germanium ions are implanted in the first nitride layer in a direction forming an acute angle with a top surface of the substrate. In block 56, germanium-implanted portions of the first nitride layer are etched away to form a first asymmetric nitride spacer confined to a first side of the gate stack. The first asymmetric nitride spacer protects a first source/drain region of the substrate from a first ion implantation. In block 58, ions are implanted in a second source/drain region of the substrate on a second side of the gate stack unprotected by the first asymmetric nitride spacer to form a first source/drain.

Figure 4:
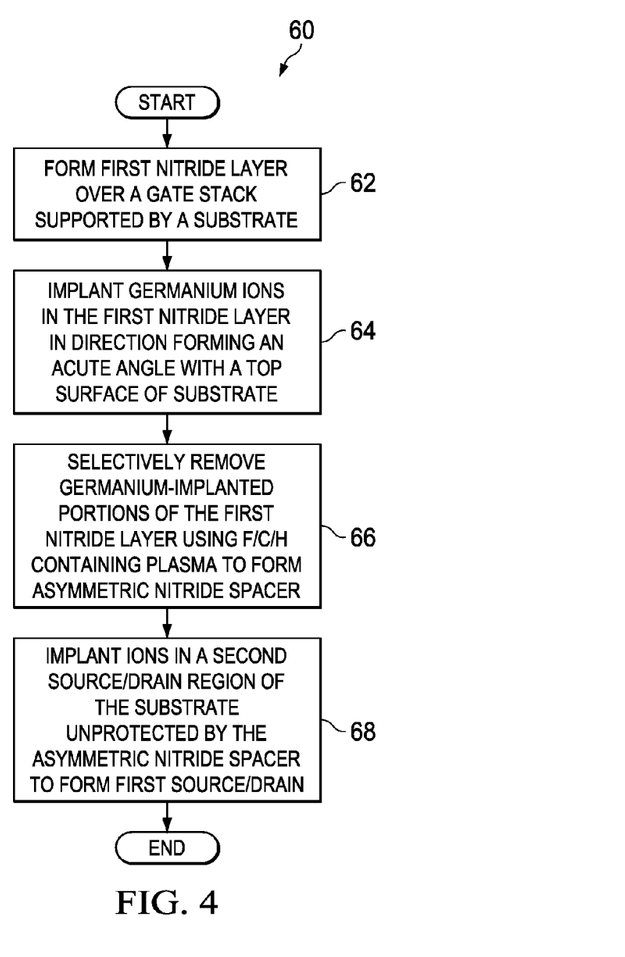
FIG. 4 illustrates another embodiment method of forming the TFET of FIG. 1.

Referring now to FIG. 4, another embodiment method 60 of forming an integrated circuit (e.g., the TFET 10 of FIG. 1) is provided. In block 62, a first nitride layer is formed over a gate stack supported by a substrate. In block 64, germanium ions are implanted in the first nitride layer in a direction forming an acute angle with a top surface of the substrate. In block 66, germanium-implanted portions of the first nitride layer are selectively removed using a fluoride/carbon/hydrogen containing plasma to form a first asymmetric nitride spacer confined to a first side of the gate stack. The first asymmetric nitride spacer protects a first source/drain region of the substrate from a first ion implantation. In block 68, ions are implanted in a second source/drain region of the substrate on a second side of the gate stack unprotected by the first asymmetric nitride spacer to form a first source/drain.

The TFET 10 of FIG. 1 has several advantages relative to a conventional TFET. For example, the source 14 and the drain 16 of the TFET 10 are self-aligned relative to the gate stack 24 due to the formation process. Therefore, the TFET 10 has a consistent threshold voltage.

An embodiment method of forming an integrated circuit includes forming a first nitride layer over a gate stack supported by a substrate, implanting germanium ions in the first nitride layer in a direction forming an acute angle with a top surface of the substrate, etching away germanium-implanted portions of the first nitride layer to form a first asymmetric nitride spacer confined to a first side of the gate stack, the first asymmetric nitride spacer protecting a first source/drain region of the substrate from a first ion implantation, and implanting ions in a second source/drain region of the substrate on a second side of the gate stack unprotected by the first asymmetric nitride spacer to form a first source/drain.

An embodiment method of forming an integrated circuit including forming a first nitride layer over a gate stack supported by a substrate, implanting germanium ions in the first nitride layer in a direction forming an acute angle with a top surface of the substrate, selectively removing germanium-implanted portions of the first nitride layer using a fluoride/carbon/hydrogen containing plasma to form a first asymmetric nitride spacer confined to a first side of the gate stack, the first asymmetric nitride spacer protecting a first source/drain region of the substrate from a first ion implantation, and implanting ions in a second source/drain region of the substrate on a second side of the gate stack unprotected by the first asymmetric nitride spacer to form a first source/drain.

An embodiment method of forming an integrated circuit includes implanting germanium ions in a first nitride layer in a direction forming an acute angle with a top surface of a substrate, etching away germanium-implanted portions of the first nitride layer to form a first asymmetric nitride spacer confined to a first side of a gate stack, the first asymmetric nitride spacer protecting a first source/drain region of the substrate from a first ion implantation, implanting ions in a second source/drain region of the substrate on a second side of the gate stack unprotected by the first asymmetric nitride spacer to form a first source/drain, and removing the first asymmetric nitride spacer using an etching process.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of forming an integrated circuit, comprising:
   forming a first nitride layer over a gate stack supported by a substrate;
   implanting germanium ions in the first nitride layer in a direction forming an acute angle with a top surface of the substrate;
   etching away germanium-implanted portions of the first nitride layer to form a first asymmetric nitride spacer confined to a first side of the gate stack, the first asymmetric nitride spacer protecting a first source/drain region of the substrate from a first ion implantation;
   implanting ions in a second source/drain region of the substrate on a second side of the gate stack unprotected by the first asymmetric nitride spacer to form a first source/drain;
   removing the first asymmetric nitride spacer using a wet etching process; and
   forming a second nitride layer over the gate stack and implanting germanium ions in the second nitride layer in the direction forming the acute angle with the top surface of the substrate.

2. The method of claim 1, further comprising etching away germanium-implanted portions of the second nitride layer to form a second asymmetric nitride spacer confined to the second side of the gate stack, the second asymmetric spacer protecting the second source/drain region of the substrate from a second ion implantation.

3. The method of claim 2, further comprising implanting ions in the first source/drain region of the substrate on the first side of the gate stack unprotected by the second asymmetric nitride spacer to form a second source/drain.

4. The method of claim 1, wherein the gate stack is a metal gate/high-k (MG/HK) gate stack formed using a gate first integration flow.

5. The method of claim 1, wherein the gate stack is a metal gate/high-k (MG/HK) gate stack formed through a gate last integration flow.

6. A method of forming an integrated circuit, comprising:
   forming a first nitride layer over a gate stack supported by a substrate;
   implanting germanium ions in the first nitride layer in a direction forming an acute angle with a top surface of the substrate;
   selectively removing germanium-implanted portions of the first nitride layer using a fluoride/carbon/hydrogen containing plasma, leaving non-germanium-implanted portions to form a first asymmetric nitride spacer confined to a first side of the gate stack, the first asymmetric nitride spacer protecting a first source/drain region of the substrate from a first ion implantation; and
   implanting ions in a second source/drain region of the substrate on a second side of the gate stack unprotected by the first asymmetric nitride spacer to form a first source/drain.

7. The method of claim 6, further comprising removing the first asymmetric nitride spacer using a wet etching process.

8. The method of claim 7, further comprising forming a second nitride layer over the gate stack and implanting germanium ions in the second nitride layer in the direction forming the acute angle with the top surface of the substrate.

9. The method of claim 8, further comprising etching away germanium-implanted portions of the second nitride layer to form a second asymmetric nitride spacer confined to the second side of the gate stack, the second asymmetric spacer protecting the second source/drain region of the substrate from a second ion implantation.

10. The method of claim 9, further comprising implanting ions in the first source/drain region of the substrate on the first side of the gate stack unprotected by the second asymmetric nitride spacer to form a second source/drain.

11. The method of claim 6, wherein the gate stack is a metal gate/high-k (MG/HK) gate stack formed using a gate first integration flow.

12. The method of claim 6, wherein the gate stack is a metal gate/high-k (MG/HK) gate stack formed through a gate last integration flow.

13. A method of forming an integrated circuit, comprising:
   implanting germanium ions in a first nitride layer in a direction forming an acute angle with a top surface of a substrate;
   etching away germanium-implanted portions of the first nitride layer to form a first asymmetric nitride spacer confined to a first side of a gate stack, the first asymmetric nitride spacer protecting a first source/drain region of the substrate from a first ion implantation, the etching completely removing the germanium-implanted portions of the first nitride layer from along a sidewall of a second side of the gate stack;
   implanting ions in a second source/drain region of the substrate on a second side of the gate stack unprotected by the first asymmetric nitride spacer to form a first source/drain; and
   removing the first asymmetric nitride spacer using an etching process.

14. The method of claim 13, wherein the first asymmetric nitride spacer is removed using a wet etching process.

15. The method of claim 14, further comprising forming a second nitride layer over the gate stack and implanting germanium ions in the second nitride layer in the direction forming the acute angle with the top surface of the substrate, and etching away germanium-implanted portions of the second nitride layer to form a second asymmetric nitride spacer confined to a second side of the gate stack, the second asymmetric spacer protecting a second source/drain region of the substrate from a second ion implantation.

16. The method of claim 15, further comprising implanting ions in the first source/drain region of the substrate on the first side of the gate stack unprotected by the second asymmetric nitride spacer to form a second source/drain.

17. The method of claim 13, wherein the gate stack is a metal gate/high-k (MG/HK) gate stack formed using a gate first integration flow.

18. The method of claim 13, wherein the gate stack is a metal gate/high-k (MG/HK) gate stack formed through a gate last integration flow.

19. The method of claim 1, wherein the etching leaves non-germanium-implanted portions to form the first asymmetric nitride spacer.

20. The method of claim 1, wherein the etching removes the germanium-implanted portions of the first nitride layer from along a sidewall of a second side of the gate stack.

* * * * *